(12) United States Patent
Choi

(10) Patent No.: US 9,345,186 B2
(45) Date of Patent: May 17, 2016

(54) ELECTRONIC COMPONENT CARRIER TAPE FEEDING DEVICE AND ELECTRONIC COMPONENT CARRIER TAPE FEEDING METHOD

(71) Applicant: HANWHA TECHWIN CO., LTD., Changwon-Si (KR)

(72) Inventor: Hyong-su Choi, Changwon (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 0 days.

(21) Appl. No.: 13/937,544

(22) Filed: Jul. 9, 2013

(65) Prior Publication Data

US 2014/0060749 A1    Mar. 6, 2014

(30) Foreign Application Priority Data

Sep. 4, 2012 (KR) .................... 10-2012-0097875

(51) Int. Cl.
| | |
|---|---|
| B32B 38/10 | (2006.01) |
| H05K 13/04 | (2006.01) |
| B65H 16/00 | (2006.01) |
| B65H 1/00 | (2006.01) |
| B32B 43/00 | (2006.01) |
| B32B 37/00 | (2006.01) |

(52) U.S. Cl.
CPC ............ *H05K 13/0417* (2013.01); *B32B 37/00* (2013.01); *B32B 38/10* (2013.01); *B32B 43/006* (2013.01); *B65H 1/00* (2013.01); *B65H 16/00* (2013.01); *Y10T 156/1168* (2015.01); *Y10T 156/1195* (2015.01); *Y10T 156/1978* (2015.01); *Y10T 156/1994* (2015.01)

(58) Field of Classification Search
CPC ...... B65H 16/00; B32B 38/10; B32B 43/006; Y10T 56/1168; Y10T 56/1978
See application file for complete search history.

(56) References Cited

U.S. PATENT DOCUMENTS

| | | | | |
|---|---|---|---|---|
| 5,053,103 | A | * | 10/1991 | Fritsch .......................... 156/751 |
| 7,930,819 | B2 | * | 4/2011 | Yonemitsu et al. ............ 29/739 |
| 8,079,396 | B2 | * | 12/2011 | Rachkov ...................... 156/539 |
| 2002/0014002 | A1 | * | 2/2002 | Bergstrom ..................... 29/740 |
| 2005/0006030 | A1 | * | 1/2005 | Bergstrom .................... 156/584 |
| 2010/0239401 | A1 | * | 9/2010 | Kim ............................ 414/412 |

FOREIGN PATENT DOCUMENTS

| | | |
|---|---|---|
| JP | 9-270594 A | 10/1997 |
| JP | 2008-243891 A | 10/2008 |
| JP | 4530865 B2 | 8/2010 |

\* cited by examiner

*Primary Examiner* — Mark A Osele
*Assistant Examiner* — Nickolas Harm
(74) *Attorney, Agent, or Firm* — Sughrue Mion, PLLC

(57) ABSTRACT

Provided are an electronic component carrier tape feeding device and an electronic component carrier tape feeding method. The electronic component carrier tape feeding device includes: a carrier tape guiding unit configured to guide a carrier tape to which a cover tape is attached; and a transfer unit configured to transfer the carrier tape. The carrier tape guiding unit includes: a guiding unit t configured to guide the carrier tape; and a cover unit surrounding a top surface of the carrier tape and comprising a protrusion portion protruding toward the cover tape.

8 Claims, 4 Drawing Sheets

ELECTRONIC COMPONENT CARRIER TAPE FEEDING DEVICE AND ELECTRONIC COMPONENT CARRIER TAPE FEEDING METHOD

CROSS-REFERENCE TO RELATED PATENT APPLICATION

This application claims priority from Korean Patent Application No. 10-2012-0097875 filed on Sep. 4, 2012 in the Korean Intellectual Property Office, the disclosure of which is incorporated herein by reference in its entirety.

BACKGROUND

1. Field

Apparatuses and methods consistent with exemplary embodiments relate to a feeding device and a feeding method, and more particularly, to an electronic component carrier tape feeding device and an electronic component carrier tape feeding method.

2. Description of the Related Art

Electronic component mounting apparatuses, which are devices that mount electronic components on printed circuit boards (PCBs), receive various electronic components such as integrated circuits, diodes, capacitors, or resistors from an electronic component feeder, transfer each of the electronic components to where the electronic component is to be mounted, and mount the electronic components on the PCB.

In the related art, electronic component mounting apparatuses include an electronic component carrier tape feeding device that feeds an electronic component, a conveyer that transfers a PCB, a head assembly that includes nozzles adsorbing the electronic component from an electronic component feeding device and mounting the electronic component on the PCB, an electronic component transfer device that moves the head assembly in a vertical direction or in a horizontal direction, and the like.

A tape feeder using an electronic component reel as shown in FIG. 1 is widely used as the electronic component carrier tape feeding device installed in the electronic component mounting apparatus. FIG. 1 is a perspective view showing an electronic component reel 1 installed in an electronic component carrier tape feeding device.

Referring to FIG. 1, the electronic component reel 1 accommodates about 2000 to 5000 electronic components 5. Accommodation portions 3a are formed in a carrier tape 3, which is wound around the electronic component reel 1, so as to be separated from each other. The accommodation portions 3a accommodate the electronic components 5 such as a semiconductor chip, and upper portions of the electronic components 5 that are accommodated in each accommodation portion 3a are sealed by a cover tape 2. A plurality of transfer holes 3b are formed on an edge of the carrier tape 3 along a traveling direction of the carrier tape 3 and are separated from each other at predetermined intervals.

A plurality of the electronic component carrier tape feeding devices are formed in the electronic component mounting apparatus and are separated from each other at regular intervals, and are disposed in parallel. The electronic component carrier tape feeding device transfers the above-mentioned carrier tape 3 to the electronic component mounting apparatus. In other words, the electronic component carrier tape feeding device reels out the carrier tape 3 from the electronic component reel 1 and peels off the cover tape 2 that covers the electronic component 5 attached to the carrier tape 3. An adsorption nozzle of a head assembly adsorbs the electronic component 5 attached to the carrier tape 3 when the cover tape 2 is peeled off to pick up the electronic component 5, and transfers the picked-up electronic component 5 to a predetermined position on a PCB.

An electronic component carrier tape feeding device of the related art includes a body portion in which the electronic component reel 1 is installed. The carrier tape 3 wound around the electronic component reel 1 is transferred at a predetermined pitch by a sprocket. The cover tape 2 separated from the carrier tape 3 is recovered by a recovering device.

When all the electronic components 5 accommodated in the electronic component reel 1 are fed, the electronic component reel 1 installed in the electronic component carrier tape feeding device needs to be replaced. When an operator replaces the electronic component reel 1, a new electronic component reel 1 is installed in the body portion, a locker installed in front of the electronic component carrier tape feeding device is unlocked, and a carrier tape guiding unit is raised to connect the carrier tape 3 and the cover tape 2 of the electronic component reel 1 that is replaced to parts of the electronic component carrier tape feeding device. When the installation of the electronic component reel 1 and the connection of the carrier tape 3 and the cover tape 2 are finished, the carrier tape guiding unit is lowered, and then the position of the locker is switched to a locking position.

As mentioned above, when the installation of the carrier tape 3 is finished, the electronic component carrier tape feeding device may operate so as to separate the cover tape 2 from the carrier tape 3. After the cover tape 2 is separated from the carrier tape 3, the adsorption nozzle adsorbs the electronic component 5 within the carrier tape 3 and moves the electronic component 5 to the outside. At this time, as mentioned above, at the time when the cover tape 2 is separated from the carrier tape 3, the electronic components 5 and the cover tape 2 may be moved together to the outside by static electricity or the like, or the position of the electronic components 5 may change. That is, the electronic components 5 may be attached to the cover tape 2 and moved to the outside. In particular, as mentioned above, when the electronic components 5 are moved to the outside by being attached to the cover tape 2 or when the position of the electronic components 5 changes, the adsorption nozzle may not adsorb the electronic component 5, and the operation may not be performed. Accordingly, when the cover tape 2 is separated from the carrier tape 3, there is a need to prevent the electronic components 5 from being moved to the outside with the cover tape 2 or to prevent the position of the electronic components 5 from changing.

The details of the above-mentioned electronic component carrier tape feeding device are disclosed in Korean Unexamined Patent Publication No. 2008-0096312 (Title: Tape Feeder for Component Mounting Device, Applicant: Samsung Techwin Co., Ltd.).

SUMMARY

One or more exemplary embodiments provide an electronic component carrier tape feeding device and an electronic component carrier tape feeding method that prevent an electronic component from moving when a cover tape is removed.

According to an aspect of an exemplary embodiment, there is provided an electronic component carrier tape feeding device including: a carrier tape guiding configured to guide a carrier tape to which a cover tape is attached; and a transfer unit configured to transfer the carrier tape, wherein the carrier tape guiding unit may include: a guiding unit configured to guide the carrier tape; and a cover unit surrounding a top surface of the carrier tape and comprising a protrusion portion protruding toward the cover tape.

The cover unit may include a cover tape peeling unit configured to peel the cover tape at a predetermined angle with respect to a travelling direction of the carrier tape.

The cover tape peeling unit may include an inclined surface with respect to the travelling direction of the carrier tape.

The inclined surface may be inclined toward the cover tape from a back side of the cover tape peeling unit to a front side of the cover tape peeling unit with respect to the traveling direction of the carrier tape.

The cover unit may further include a movement prevention unit disposed at a predetermined interval from the cover tape peeling unit and configured to prevent the cover tape from moving in the travelling direction of the carrier tape.

The cover unit may further include an insertion hole disposed between the movement prevention unit and the cover tape peeling unit.

The protrusion portion may include a first protrusion portion provided in the cover tape peeling unit.

The first protrusion portion may be configured to prevent electronic components from protruding through the insertion hole.

The protrusion portion may include a first protrusion portion provided in the cover tape peeling unit.

The protrusion portion may further include a second protrusion portion disposed at a predetermined interval behind the first protrusion portion with respect to the travelling direction of the carrier tape.

The protrusion portion may include a bent portion.

According to an aspect of another exemplary embodiment, there is provided an electronic component carrier tape feeding method including: providing electronic components in a carrier tape with a cover tape attached to a top surface of the carrier tape; inserting the carrier tape into a feeding device; transferring the carrier tape in a traveling direction; separating the electronic components from the cover tape; separating the cover tape from the carrier tape; and discharging the electronic components from the carrier tape.

The separating of the electronic components from each other may include: pressing the cover tape by a first protrusion portion toward the carrier tape to separate the electronic components from the cover tape; and pressing the cover tape by a second protrusion portion to separate the electronic components from the cover tape.

The second protrusion portion may be disposed at a predetermined interval behind the first protrusion portion with respect to the travelling direction of the carrier tape.

The electronic component carrier tape feeding method may further include pressing the electronic components against a bottom of the carrier tape by a third protrusion portion after the separating of the cover tape from the carrier tape.

BRIEF DESCRIPTION OF THE DRAWINGS

The above and/or other features and advantages of exemplary embodiments will become more apparent with reference to the attached drawings in which.

DETAILED DESCRIPTION

Hereinafter, reference will be made in detail to exemplary embodiments, examples of which are illustrated in the accompanying drawings. The inventive concepts may, however, be embodied in many different forms and should not be construed as limited to the exemplary embodiments set forth herein. Rather, the exemplary embodiments are provided so that this disclosure will be thorough and complete, and will fully convey the scope of the invention to those of ordinary skill in the art. The terminology used herein is for the purpose of describing particular embodiments only and is not intended to be limiting of the present invention. As used herein, the singular forms 'a', 'an', and 'the' are intended to include the plural forms as well, unless the context clearly indicates otherwise. It will be further understood that the terms 'comprises' and/or 'comprising,' when used in this specification, specify the presence of stated features, integers, operations, elements, and/or components, but do not preclude the presence or addition of one or more other features, integers, operations, elements, components, and/or groups thereof. It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Figure 2:
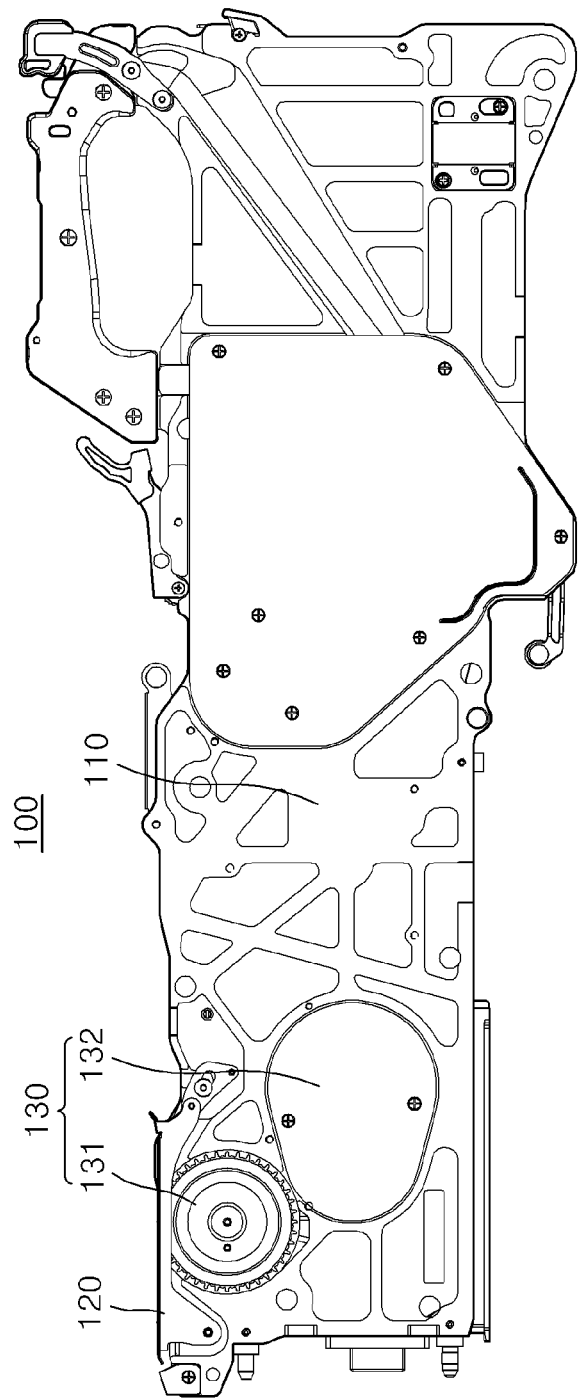
FIG. 2 is a side view showing the electronic component carrier tape feeding device according to an exemplary embodiment.

FIG. 2 is a side view showing the electronic component carrier tape feeding device 100 according to an exemplary embodiment.

Referring to FIG. 2, the electronic component carrier tape feeding device 100 may include a body portion 110 that forms the exterior of the electronic component carrier tape feeding device 100. The electronic component carrier tape feeding device 100 may include a carrier tape guiding unit 120 that is installed in the body portion 110 and guides the carrier tape 3 to which the cover tape 2 is attached. The carrier tape guiding unit 120 may be installed in the body portion 110 so as to be rotatable.

In addition, the electronic component carrier tape feeding device 100 may include a transfer unit 130 that is installed inside the body portion 110, is disposed below the carrier tape 3, and transfers the carrier tape 3. The transfer unit 130 may include a sprocket 131 which is partially inserted into the plurality of transfer holes 3b of the carrier tape 3. In addition, the transfer unit 130 may include a driving unit 132 that is connected to the sprocket 131 and rotates the sprocket 131.

Hereinafter, the carrier tape guiding unit 120 will be described in detail.

Figure 1:
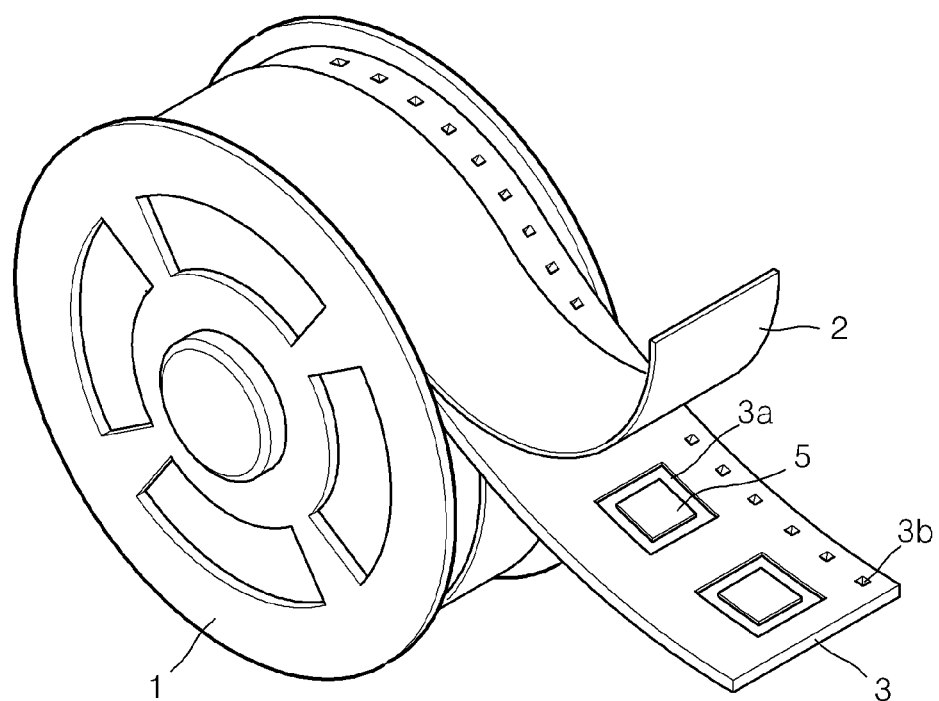
FIG. 1 is a perspective view showing an electronic component reel installed in an electronic component carrier tape feeding device.
Figure 3:
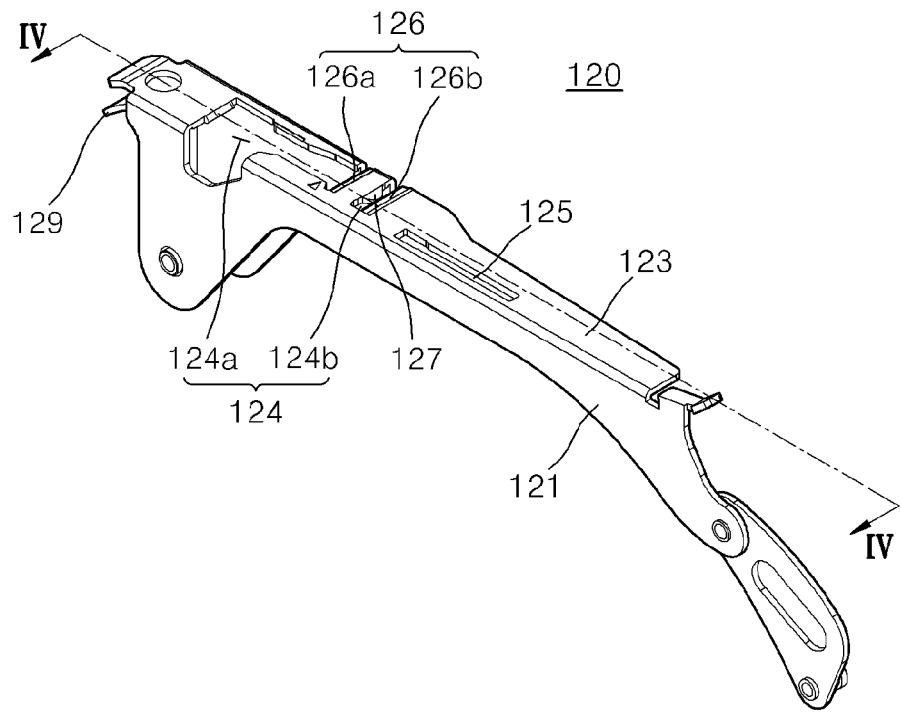
FIG. 3 is a perspective view showing a carrier tape guiding unit shown in FIG. 1 according to an exemplary embodiment.
Figure 4:
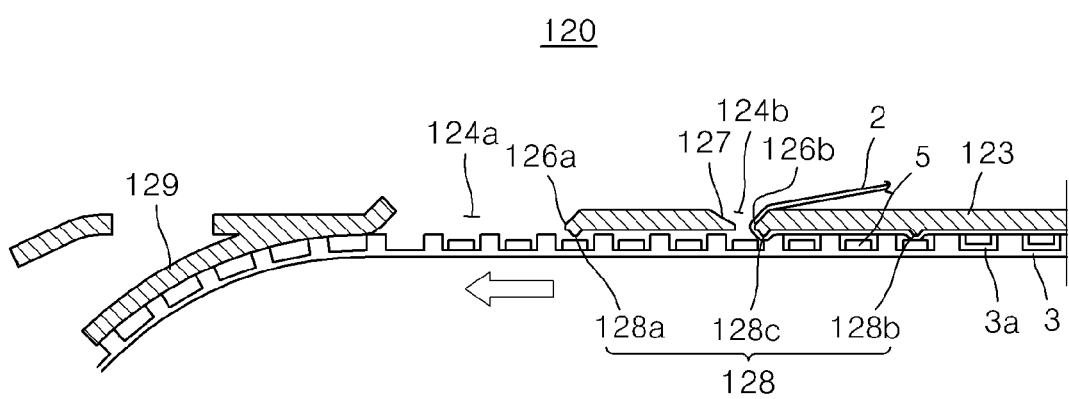
FIG. 4 is a cross-sectional view taken along a line IV-IV of FIG. 3.

FIG. 3 is a perspective view showing the carrier tape guiding unit 120 shown in FIG. 1 according to an exemplary embodiment. FIG. 4 is a cross-sectional view taken along a line IV-IV of FIG. 3 according to an exemplary embodiment.

Referring to FIGS. 3 and 4, the carrier tape guiding unit 120 may include a guiding unit 121 that is installed on the side of the body portion 110 and guides the carrier tape 3. In addition, the carrier tape guiding unit 120 may include a cover unit 123 that is formed to be bent from the guiding unit 121 and surrounds a top surface of the carrier tape 3.

At least one insertion hole 124 into which the cover tape 2 is inserted may be formed in the cover unit 123. In the present exemplary embodiment, the insertion hole 124 may include a first insertion hole 124a and a second insertion hole 124b according to the position thereof. In addition, the cover unit 123 may be formed with a sprocket insertion hole 125 into which a part of the sprocket 131 is inserted so as to protrude out from the sprocket insertion hole 125. At this time, a part of the sprocket 131 which is inserted into the transfer hole 3b protrudes into the sprocket insertion hole 125, thereby preventing the sprocket 131 from colliding with the cover unit 123 during the rotation of the sprocket 131.

Meanwhile, the cover unit 123 may include a cover tape peeling unit 126 that bends the cover tape 2 at a predetermined angle with respect to a traveling direction of the carrier tape 3. The cover tape peeling unit may be formed so as to be inclined. Specifically, the cover tape peeling unit 126 may be formed so as to be inclined along the traveling direction of the carrier tape 3. In particular, the cover tape peeling unit 126 may be inclined in such a manner that the back side thereof is higher in height than the front side based on the traveling direction of the carrier tape 3. That is, the cover tape peeling unit 126 may be inclined toward the cover tape from a back side of the cover tape peeling unit 126 toward a front side of the cover tape peeling unit 126 with respect to the traveling direction of the carrier tape 3.

In addition, the cover tape peeling unit 126 may include a first cover tape peeling unit 126a that is formed in the first insertion hole 124a, and a second cover tape peeling unit 126b that is formed in the second insertion hole 124b.

The cover unit 123 may include a movement prevention unit 127 that is formed so as to be separated from the cover tape peeling unit 126 at a predetermined interval. In the current exemplary embodiment, the movement prevention unit 127 may prevent the cover tape 2 from moving in the traveling direction of the carrier tape 3.

In particular, the above-mentioned movement prevention unit 127 may be formed so as to be separated from the second cover tape peeling unit 126b at a predetermined interval. Specifically, the movement prevention unit 127 and the second cover tape peeling unit 126b may together form the second insertion hole 124b.

Meanwhile, the carrier tape guiding unit 120 may include a protrusion portion 128 that is formed in the cover unit 123. In the present exemplary embodiment, the protrusion portion may protrude toward the carrier tape 3 and the cover tape 2 from the cover unit 123. Specifically, the protrusion portion may protrude toward the carrier tape 3 and the cover tape 2 from a lower surface of the cover unit 123.

Further, a plurality of the protrusion portions may be formed on the lower surface of the cover unit 123. Specifically, the plurality of protrusion portions may include a first protrusion portion 128a that is formed in the first cover tape peeling unit 126a, and a second protrusion portion 128b that is formed so as to be separated from the first protrusion portion 128a at a predetermined interval. In the present exemplary embodiment, the second protrusion portion 128b may be formed further behind the first protrusion portion 128a based on the traveling direction A of the carrier tape 3.

In addition, the plurality of protrusion portions may include a third protrusion portion 128c that is formed in the second cover tape peeling unit 126b.

The third protrusion portion 128c may be formed at one end of the second cover tape peeling unit 126b so as to protrude toward the carrier tape 3 and the cover tape 2. At this time, the third protrusion portion 128c may be formed in a similar manner to the above-mentioned first protrusion portion 128a.

The first protrusion portion 128a, the second protrusion portion 128b and the third protrusion portion 128c may be formed so as to be bent. The protrusion portion 128a, the second protrusion portion 128b and the third protrusion portion 128c may have a semicircular shape. Alternatively, the first protrusion portion 128a, the second protrusion portion 128b and the third protrusion portion 128c may be formed with at least one surface being inclined.

For example, the first protrusion portion 128a, the second protrusion portion 128b and the third protrusion portion 128c may be inclined in the traveling direction of the carrier tape 3. In the present exemplary embodiment, the first protrusion portion 128a, the second protrusion portion 128b and the third protrusion portion 128c may be formed in such a manner that the size of the protrusion portions increases from the back side to the front side with respect to the traveling direction of the carrier tape 3. Accordingly, the first protrusion portion 128a, the second protrusion portion 128b and the third protrusion portion 128c may sequentially press along the traveling direction of the cover tape 2.

Meanwhile, the carrier tape guiding unit 120 may include a discharge guiding unit 129 that is formed in the cover unit 123 and guides the carrier tape 3 after the electronic component 5 is discharged from the accommodation portion 3a of the carrier tape 3. At this time, the discharge guiding unit 129 may be formed so as to be bent. Specifically, the discharge guiding unit 129 may be formed so as to be bent from the upper side of the body portion 110 to the lower side thereof. Therefore, the discharge guiding unit 129 may guide the carrier tape 3 to the lower side of the body portion 110 after the electronic component 5 is separated from the carrier tape 3 from which the cover tape 2 is separated.

Hereinafter, the operation of the electronic component carrier tape feeding device 100 will be described in detail based on the carrier tape guiding unit 120.

Figure 5:
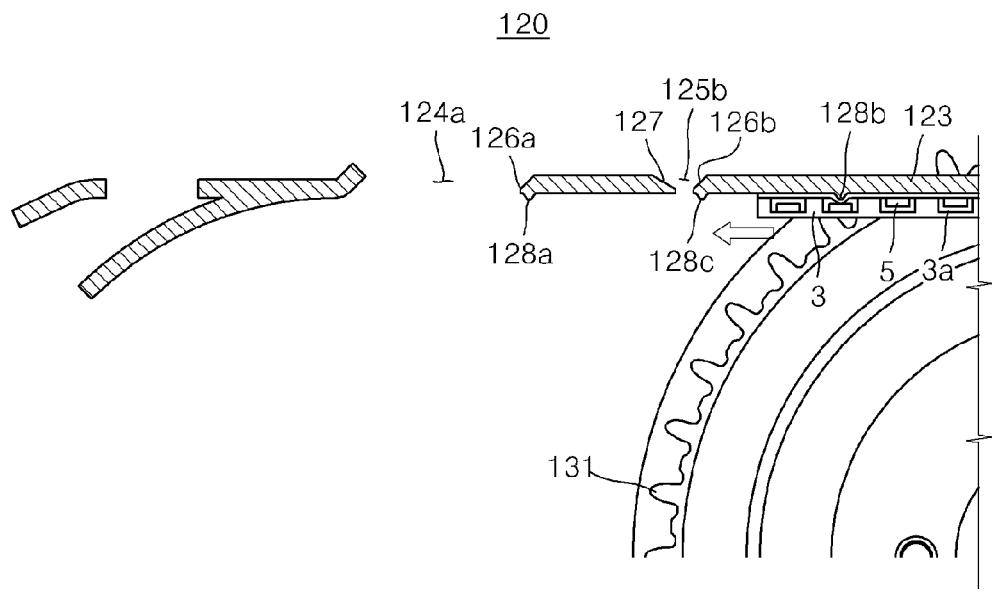
FIG. 5 is a conceptual diagram showing a first operating state of the carrier tape guiding unit shown in FIG. 3 according to an exemplary embodiment.
Figure 6:
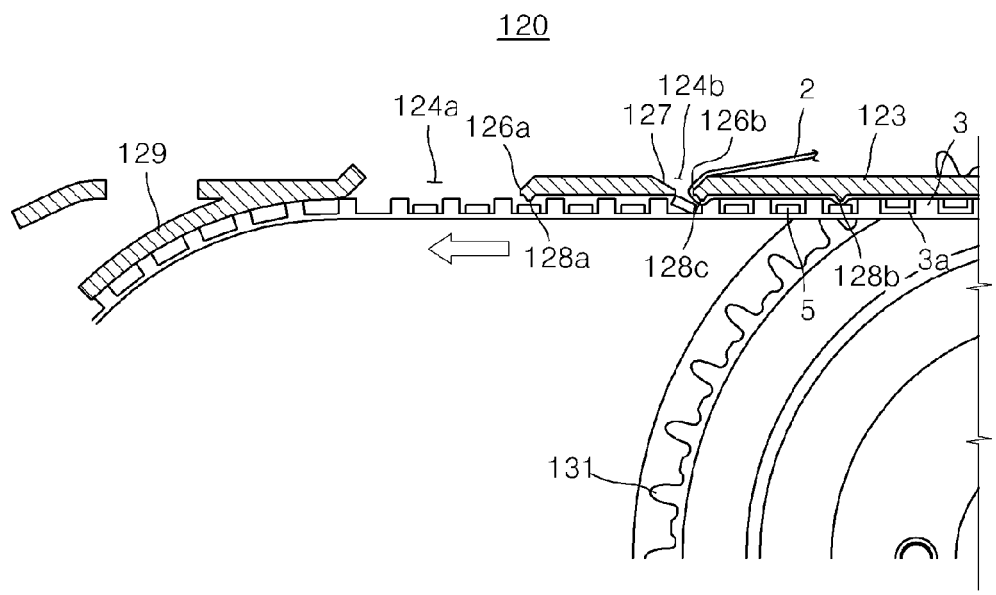
FIG. 6 is a conceptual diagram showing a second operating state of the carrier tape guiding unit shown in FIG. 3 according to an exemplary embodiment.

FIG. 5 is a conceptual diagram showing a first operating state of the carrier tape guiding unit 120 shown in FIG. 3 according to an exemplary embodiment. FIG. 6 is a conceptual diagram showing a second operating state of the carrier tape guiding unit 120 shown in FIG. 3 according to an exemplary embodiment.

Referring to FIGS. 5 and 6, after the electronic component carrier tape feeding device 100 is installed in the electronic component mounting apparatus (not shown), the cover tape 2 may be separated from the carrier tape 3 and may be inserted into the first insertion hole 124a or the second insertion hole 124b. At this time, the cover tape 2 may be inserted into the first insertion hole 124a or the second insertion hole 124b according to a user's selection.

As described above, after the cover tape 2 is inserted into the first insertion hole 124a or the second insertion hole 124b, the cover tape 2 may be bent in a direction different from a traveling direction of the carrier tape 3 based on geometric characteristics of the first cover tape peeling unit 126a or the second cover tape peeling unit 126b.

In the present exemplary embodiment, the bent portion of the cover tape 2 may be supported by the first cover tape peeling unit 126a or the second cover tape peeling unit 126b.

In particular, one end of the cover tape 2 of the above-mentioned bent portion may be inserted into a cover tape recovering unit (not shown) which may move the cover tape 2 in a direction different from the traveling direction of the carrier tape 3. In the present exemplary embodiment, the cover tape recovering unit may move the cover tape 2 in a direction opposite to the traveling direction of the carrier tape 3.

Meanwhile, hereinafter, for convenience of description, a case will be mainly described in detail where the cover tape 2 is inserted into the second insertion hole 124b as shown in FIG. 6.

As described above, when the installation of the cover tape 2 is finished, the driving unit 132 may be driven while the electronic component carrier tape feeding device 100 starts to operate. At this time, the sprocket 131 is rotated in accordance with the operation of the driving unit 132, and a part of the sprocket 131 is inserted into the plurality of transfer holes 3b to thereby move the carrier tape 3 in the traveling direction.

As described above, while the driving unit 132 operates, the tape recovering unit operates to thereby move the cover tape 2 in the direction opposite to the traveling direction of the carrier tape 3. At this time, the cover tape 2 may be separated from the carrier tape 3 while moving along the second cover tape peeling unit 126b. In particular, the cover tape 2 may move along the slope of the second cover tape peeling unit 126b in the above-mentioned manner.

Meanwhile, as described above, when the cover tape 2 is peeled from the carrier tape 3, the electronic component 5 may be attached to the cover tape 2 by static electricity or the like. For example, the electronic component 5 may be attached to the cover tape 2 in a state where the electronic component 5 is separated from the lower surface of the accommodation portion 3a at a predetermined distance.

As described above, when the electronic component 5 is attached to the cover tape 2 and when the electronic component 5 and the cover tape 2 are peeled from the carrier tape 3, the electronic component 5 and the cover tape 2 may be discharged together to the outside. Therefore, the adsorption nozzle may not adsorb the electronic component 5, and thus a malfunction may occur in the electronic component mounting apparatus.

In the present exemplary embodiment, as described above, when the carrier tape 3 moves, the electronic component 5 disposed below the second cover tape peeling unit 126b may be pressed into the accommodation portion 3a by the third protrusion portion 128c. Specifically, the third protrusion portion 128c may press the electronic component 5, which is attached to the cover tape 2 by static electricity or the like, toward the bottom of the carrier tape 3.

In addition, as described above, when the carrier tape 3 moves, the second protrusion portion 128b may also press the cover tape 2. Specifically, the second protrusion portion 128b is disposed further behind the third protrusion portion 128c with respect to the traveling direction of the carrier tape 3 to thereby press the cover tape 2 and the electronic component 5.

In particular, the second protrusion portion 128b may firstly press the electronic component 5 attached to the cover tape 2 in accordance with the movement of the carrier tape 3. In addition, the third protrusion portion 128c may secondly press the electronic component 5 pressed by the second protrusion portion 128b in accordance with the movement of the carrier tape 3.

In the present exemplary embodiment, the first, second and third protrusion portions 128a, 128b and 128c may be formed in such a manner that parts thereof may be pressed back into the accommodation portion 3a when the electronic component 5 is attached to the cover tape 2 by static electricity or the like. In particular, when the carrier tape 3 moves, the first, second and third protrusion portions 128a, 128b and 128c may press the cover tape 2 inward to the accommodation portion 3a.

As described above, when the cover tape 2 is pressed inward to the accommodation portion 3a, the electronic component 5 attached to the cover tape 2 may move to the bottom of the accommodation portion 3a. At this time, the electronic component 5 may be separated from the cover tape 2 and placed on the bottom of the accommodation portion 3a.

In particular, when the carrier tape 3 moves, the second protrusion portion 128b may first press the lower side of the cover tape 2. At this time, as described above, the second protrusion portion 128b presses the cover tape 2 so as to move the electronic component 5 to the bottom of the accommodation portion 3a.

As described above, after the second protrusion portion 128b presses the cover tape 2, the cover tape 2 may be separated from the carrier tape 3 while the carrier tape 3 continuously moves.

At this time, as described above, when the cover tape 2 is peeled, the third protrusion portion 128c may press the cover tape 2 once again. In particular, as described above, the third protrusion portion 128c may prevent the component 5 from protruding through the second insertion hole 124b while pressing the cover tape 2.

Therefore, the electronic component 5 disposed in the accommodation portion 3a may be firstly separated from the cover tape 2 by the second protrusion portion 128b, and may be secondly separated from the cover tape 2 by the third protrusion portion 128c so as to be prevented from being discharged to the outside.

Meanwhile, as described above, the electronic components 5 whose position is aligned may accurately be adsorbed to the adsorption nozzle of the electronic component mounting apparatus. In particular, unlike in the related art, the electronic components 5 and the cover tape 2 are not discharged together, and thus the malfunction of the electronic component mounting apparatus may be prevented.

At this time, the adsorption nozzle may adsorb the electronic components 5 whose position is aligned and discharge the electronic components 5 to the outside. Specifically, the adsorption nozzle may discharge the electronic components 5 to the outside of the carrier tape 3 to thereby move the electronic components 5 to an external electronic device.

Therefore, the electronic component carrier tape feeding device 100 may prevent the electronic components 5 from being attached to the cover tape 2 and discharged to the outside when the cover tape 2 and the carrier tape 3 are peeled from each other. In particular, the electronic component carrier tape feeding device 100 may align the position of the electronic components 5 with the position of the adsorption nozzle so as to prevent the malfunction of the electronic component mounting apparatus, thereby increasing the efficiency and speed of the operation.

In the exemplary embodiments, it is possible to prevent an electronic component from being attached to a cover tape and thus being discharged to the outside when the cover tape and a carrier tape are peeled from each other. In particular, the electronic component carrier tape feeding device can align the position of an electronic component with the position of an adsorption nozzle so as to prevent the malfunction of the electronic component mounting apparatus, thereby increasing the efficiency and speed of the operation.

While exemplary embodiments have been particularly shown and described above, it will be understood by those of ordinary skill in the art that various changes in form and details may be made therein without departing from the spirit and scope of the present inventive concept as defined by the following claims.

What is claimed is:

1. An electronic component carrier tape feeding device comprising:
   a carrier tape guiding unit configured to guide a carrier tape carrying an electronic component, a cover tape attached to a first surface of the carrier tape; and
   a transfer unit configured to transfer the carrier tape from an electronic component feeder to an adsorption nozzle,
   wherein the carrier tape guiding unit comprises:
      a guiding unit provided on a side of the carrier tape guiding unit and configured to guide the carrier tape; and
      a cover unit surrounding a top surface of the carrier tape and comprising a cover tape peeling unit configured to peel the cover tape from the carrier tape, the cover tape peeling unit comprising a protrusion protruding from the cover tape peeling unit toward the first surface of the carrier tape,
   wherein a portion of the cover tape separated from the carrier tape exits the carrier tape guiding unit through an insertion hole provided at the cover tape peeling unit,
   wherein the cover tape peeling unit is configured to peel the cover tape at a predetermined angle with respect to the traveling direction of the carrier tape,
   wherein the cover tape peeling unit comprises an inclined surface with respect to the traveling direction of the carrier tape, and
   wherein the protrusion protrudes toward the first surface of the carrier tape such that the protrusion pushes the electronic component toward the carrier tape in response to the cover tape peeling unit separating the cover tape from the carrier tape.

2. The electronic component carrier tape feeding device of claim 1, wherein the inclined surface inclines toward the cover tape from a back side of the cover tape peeling unit to a front side of the cover tape peeling unit with respect to the traveling direction of the carrier tape.

3. The electronic component carrier tape feeding device of claim 1, wherein the cover unit further comprises a movement prevention unit disposed at a predetermined interval from the cover tape peeling unit and configured to prevent the cover tape from moving in the traveling direction of the carrier tape.

4. The electronic component carrier tape feeding device of claim 3, wherein the insertion hole is formed by the movement prevention unit and the cover tape peeling unit.

5. The electronic component carrier tape feeding device of claim 1, wherein the protrusion comprises a first protrusion provided in the cover tape peeling unit.

6. The electronic component carrier tape feeding device of claim 5, wherein the protrusion further comprises a second protrusion disposed at a predetermined interval upstream of the first protrusion with respect to the traveling direction of the carrier tape.

7. The electronic component carrier tape feeding device of claim 1, wherein the protrusion comprises a portion bent from the cover unit.

8. The electronic component carrier tape feeding device of claim 1, wherein the protrusion is configured to separate an electronic component from the carrier tape, configured to push the electronic component towards the carrier tape and configured to prevent the electronic component from exiting the carrier tape guiding unit along with the carrier tape through the insertion hole.

* * * * *